United States Patent
Chen et al.

(10) Patent No.: US 7,071,100 B2
(45) Date of Patent: Jul. 4, 2006

(54) METHOD OF FORMING BARRIER LAYER WITH REDUCED RESISTIVITY AND IMPROVED RELIABILITY IN COPPER DAMASCENE PROCESS

(76) Inventors: Kei-Wei Chen, No. 6, Li-Hsin Rd. 6, Science Based Industrial Park, Hsin-Chu (TW); Jung-Chih Tsao, No. 6, Li-Hsin Rd. 6, Science Based Industrial Park, Hsin-Chu (TW); Chi-Wen Liu, No. 6, Li-Hsin Rd. 6, Science Based Industrial Park, Hsin-Chu (TW); Jchung-Chang Chen, No. 6, Li-Hsin Rd. 6, Science Based Industrial Park, Hsin-Chu (TW); Shih-Tzung Chang, No. 6, Li-Hsin Rd. 6, Science Based Industrial Park, Hsin-Chu (TW); Shih-Ho Lin, No. 6, Li-Hsin Rd. 6, Science Based Industrial Park, Hsin-Chu (TW); Yu-Ku Lin, No. 6, Li-Hsin Rd. 6, Science Based Industrial Park, Hsin-Chu (TW); Ying-Lang Wang, No. 6, Li-Hsin Rd. 6, Science Based Industrial Park, Hsin-Chu (TW)

( * ) Notice: Subject to any disclaimer, the term of this patent is extended or adjusted under 35 U.S.C. 154(b) by 27 days.

(21) Appl. No.: 10/788,912

(22) Filed: Feb. 27, 2004

(65) Prior Publication Data
US 2005/0191855 A1    Sep. 1, 2005

(51) Int. Cl.
H01L 21/4763    (2006.01)
(52) U.S. Cl. .................................. 438/643
(58) Field of Classification Search ................ 438/622, 438/637, 638, 643, 644, 656, 660, 666, 672, 438/686, 687, 706, 707
See application file for complete search history.

(56) References Cited

U.S. PATENT DOCUMENTS

| 5,904,565 | A  | * | 5/1999  | Nguyen et al. | ............. 438/687 |
| 6,284,657 | B1 | * | 9/2001  | Chooi et al.  | ............. 438/687 |
| 6,436,303 | B1 | * | 8/2002  | Kim et al.    | ............. 216/67  |
| 6,525,428 | B1 | * | 2/2003  | Ngo et al.    | ............. 257/774 |
| 6,642,141 | B1 | * | 11/2003 | Smith et al.  | ............. 438/637 |
| 6,878,615 | B1 | * | 4/2005  | Tsai et al.   | ............. 438/618 |

(Continued)

Primary Examiner—Asok Kumar Sarkar
(74) Attorney, Agent, or Firm—Tung & Associates

(57) ABSTRACT

A method for forming a copper dual damascene with improved copper migration resistance and improved electrical resistivity including providing a semiconductor wafer including upper and lower dielectric insulating layers separated by a middle etch stop layer; forming a dual damascene opening extending through a thickness of the upper and lower dielectric insulating layers wherein an upper trench line portion extends through the upper dielectric insulating layer thickness and partially through the middle etch stop layer; blanket depositing a barrier layer including at least one of a refractory metal and refractory metal nitride to line the dual damascene opening; carrying out a remote plasma etch treatment of the dual damascene opening to remove a bottom portion of the barrier layer to reveal an underlying conductive area; and, filling the dual damascene opening with copper to provide a substantially planar surface.

22 Claims, 3 Drawing Sheets

U.S. PATENT DOCUMENTS

2002/0064941 A1* 5/2002 Chooi et al. ................ 438/633
2002/0155695 A1* 10/2002 Lee et al. ................... 438/622
2005/0042889 A1* 2/2005 Lee et al. ................... 438/780
2005/0110153 A1* 5/2005 Wu et al. ................... 257/762

* cited by examiner

METHOD OF FORMING BARRIER LAYER WITH REDUCED RESISTIVITY AND IMPROVED RELIABILITY IN COPPER DAMASCENE PROCESS

FIELD OF THE INVENTION

This invention generally relates to semiconductor device manufacturing methods and more particularly to a method for forming copper damascenes with reduced electrical resistivity and improved reliability.

BACKGROUND OF THE INVENTION

In forming damascene structures in integrated circuit manufacturing processes, barrier layer uniformity is critical for achieving acceptable copper diffusion resistance and for achieving electrical resistances within required IC performance standard constraints. A damascene opening, for example a dual damascene opening is formed in an inter-metal dielectric insulating layer by a series of photolithographic patterning and etching processes, followed by formation of a barrier layer and a metal filling process.

Increasingly, low-K layers are required to reduce signal delay and power loss effects as integrated circuit devices are scaled down. One way this has been accomplished has been to introduce porosity or dopants into the dielectric insulating layer, also referred to as an inter-metal dielectric (IMD) layer.

One problem with using porous low-k materials together with using copper as the metal filling in a copper damascene process is the susceptibility of the low-k materials to copper diffusion into the IMD layers, which has the effect of altering the dielectric constant of the IMD layer and degrading damascene electrical resistivity. Prior art processes have proposed different barrier layer materials for use with copper and porous low-k materials including refractory metals and refractory metal nitrides have been used to both form a robust barrier layer while achieving reduced copper damascene electrical resistivities.

As device characteristic dimensions have decreased below about 0.25 microns and lower including less than about 0.17 microns, adequate step coverage of damascene openings with barrier layer deposition methods has become a challenge. Prior art processes have attempted to use various physical vapor deposition (PVD) processes to achieve adequate step coverage. However, PVD processes are inherently limited in depositing thin layers of materials in smaller openings due to the physical nature of sputter deposition processes. For example, PVD processes tend to form a higher coverage at the bottom of the opening compared with the sidewall portions. In addition, with respect to a dual damascene process, barrier layer coverage tends to be thinned at corner portions, e.g., bottom via corner and via/trench transition portions of the dual damascene, making copper diffusion into the IMD layer more likely. In addition, barrier layer coverage over the via bottom portion and sidewall portions in the upper trench portion is generally formed with a relatively increased thickness thereby undesirably increasing electrical resistances.

There is therefore a need in the semiconductor processing art for a method for forming copper damascenes with improved barrier layer coverage uniformity while reducing a contribution to electrical resistivity thereby improving performance and reliability of an integrated circuit.

It is therefore among the objects of the present invention to provide a method for forming copper damascenes with improved barrier layer coverage uniformity while reducing a contribution to electrical resistivity thereby improving performance and reliability of an integrated circuit, in addition to overcoming other shortcomings of the prior art.

SUMMARY OF THE INVENTION

To achieve the foregoing and other objects, and in accordance with the purposes of the present invention, as embodied and broadly described herein, the present invention provides a method for forming a copper dual damascene with improved copper migration resistance and improved electrical resistivity.

In a first embodiment, the method includes providing a semiconductor wafer including upper and lower dielectric insulating layers separated by a middle etch stop layer; forming a dual damascene opening extending through a thickness of the upper and lower dielectric insulating layers wherein an upper trench line portion extends through the upper dielectric insulating layer thickness and partially through the middle etch stop layer; blanket depositing a barrier layer including at least one of a refractory metal and refractory metal nitride to line the dual damascene opening; carrying out a remote plasma etch treatment of the dual damascene opening to remove a bottom portion of the barrier layer to reveal an underlying conductive area; and, filling the dual damascene opening with copper to provide a substantially planar surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to an exemplary dual damascene formation process, it will be appreciated that the method of the present invention applies generally to the formation of damascenes including dual damascenes whereby stacked multi-layer inter-metal dielectric (IMD) layers, also referred to as an inter-layer dielectric (ILD), may be formed with an intervening etch stop layer to improve barrier layer coverage, resistance to copper electro-migration, and improved electrical performance and reliability. Although the method of the present invention is particularly advantageous in forming copper damascenes with characteristic dimensions of less than about 0.17 microns, and aspect ratios (depth to diameter/width) of greater than about 6 to 1, it will be appreciated that the method of the present invention may be adapted to larger characteristic dimension damascene processes.

By the term damascene is meant any metal filled opening formed in a dielectric insulating layer e.g., both single and dual damascenes. Further, although the method is particularly applicable and advantageously applied to copper filled damascenes, it will be appreciated that the metal used to fill the damascene opening may include other metals such as tungsten, aluminum, and copper alloys. The method of the present invention is particularly advantageously used in the formation of copper damascene features such as vias and trench lines with linewidths/diameters less than about 0.25 microns, more preferably less than about 0.17 microns, e.g., 0.13 microns and lower. In addition, the method is particularly advantageously used with silicon oxide based low-K dielectric insulating layers having an interconnecting porous structure and having a dielectric constant of less than about 3.0 including less than about 2.5, for example from about 2.2 to about 3.0. Further, the term 'copper' will be understood to include copper and alloys thereof.

For example, in an exemplary embodiment, referring to FIGS. 1A–1F, are shown cross sectional views of a portion of a multi-level semiconductor device at stages in an integrated circuit manufacturing process.

Figure 1A:
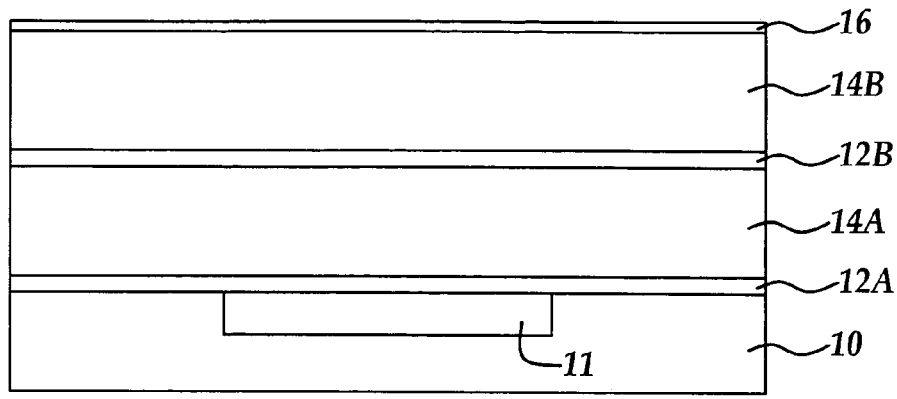
FIGS. 1A to 1F are cross sectional views of a dual damascene structure at stages of manufacture according to an embodiment of the invention.

Referring to FIG. 1A, a conductive region 11, for example a conductive metal interconnect, e.g., a copper damascene, is formed in a dielectric insulating layer 10 by conventional processes known in the micro-electronic integrated circuit manufacturing process followed by deposition of an overlying first etch stop layer 12A, preferably including at least one of silicon nitride (e.g., SiN, $Si_3N_4$), silicon oxynitride (e.g., SiON), and silicon carbide (e.g., SiC) to a thickness of about 300 Angstroms to about 700 Angstroms by a conventional CVD method, for example LPCVD or PECVD. Most preferably, the first etch stop layer 12A is formed of silicon nitride.

Still referring to FIG. 1A, formed over first etch stop layer 12A is first dielectric insulating (IMD) layer 14A, preferably formed of a silicon oxide based low-K material having a porous structure, for example including interconnecting pores. The dielectric insulating layer 14A is preferably formed by a PECVD process including organo-silane precursors such as methylsilanes, for example, tetramethylsilane and trimethylsilane. In addition, organo-siloxane precursors such as cyclo-tetra-siloxanes may be used as well to form the IMD layer portion 14A. The dielectric insulating layer 14A may additionally be formed of fluorinated silicate glass (FSG). Preferably the lower IMD layer portion 14A is formed at a thickness sufficient to encompass a via portion of a subsequently formed dual damascene structure, for example from about 1000 Angstroms to about 2700 Angstroms in thickness.

Still referring to FIG. 1A, second etch stop layer 12B is deposited, preferably formed of a composite layer including at least two different material layers, preferably one of the material layers, preferably a lowermost layer, is formed of silicon nitride (e.g., SiN, $Si_3N_4$) or silicon oxynitride (e.g., SiON), (e.g., SiON) of about 200 to about 400 Angstroms in thickness. Another layer, preferably an uppermost layer, for example an overlying layer, is formed of silicon carbide (e.g., SiC) or silicon oxycarbide (e.g., SiOC) formed at a thickness of about 100 Angstroms to about 300 Angstroms.

Most preferably, the composite etch stop layer 12B is formed of a lowermost layer of silicon nitride and an overlying (uppermost) layer of silicon carbide. The etch stop layer 12B may be formed by conventional CVD processes, for example PECVD or LPCVD. The composite etch stop layer 12B serves to add increased resistance to copper migration and advantageously enables etching endpoint detection using conventional methods, such as optical detection of etching plasma constituents, to enable controlled partial etching through a thickness of the composite etch stop layer 12B as further explained below.

Still referring to FIG. 1A, a second dielectric insulating layer 14B is then deposited, for example formed of the same preferred materials and the same manner as the first dielectric insulating layer portion 14A. The upper IMD layer 14B is preferably deposited to a thickness sufficient to encompass a trench line portion of a subsequently formed dual damascene structure. Still referring to FIG. 1A, an optional ARC layer 16, organic or inorganic material, preferably formed of silicon oxynitride, is deposited overlying the upper dielectric insulating layer 14B.

Figure 1B:
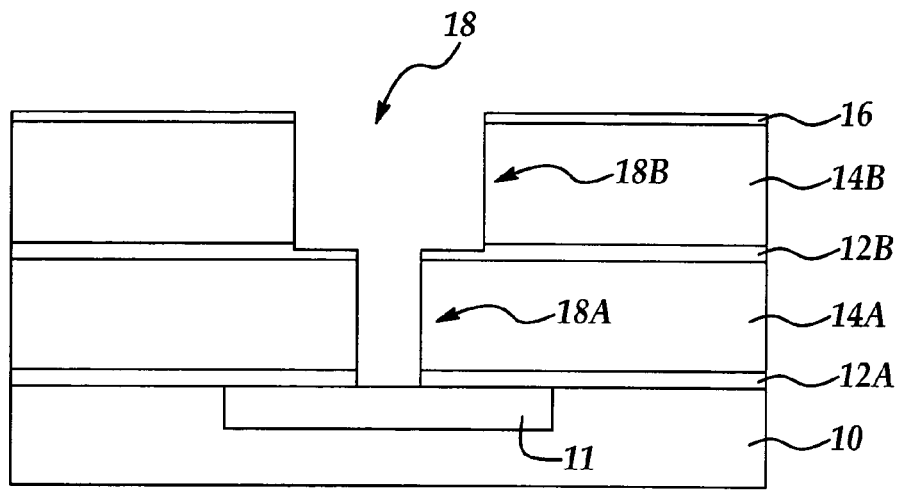

Referring to FIG. 1B, conventional photolithographic patterning and dry etching processes are then carried to form a dual damascene opening 18, for example exposing the underlying conductive area 11. For example a via opening 18A, is first formed by conventional photolithographic patterning and reactive ion etch (RIE) processes, preferably, but not exclusively formed having a diameter of less than about 0.25 microns, more preferably less than about 0.17 microns. In an important aspect of the invention, the trench opening portion 18B is etched by a conventional RIE etch process to stop on the composite SiON/SiC second etch stop layer 12B, preferably including etching through a thickness portion, preferably through the thickness of the uppermost layer, but not through the entire thickness of the second stop layer 12B.

Figure 1C:
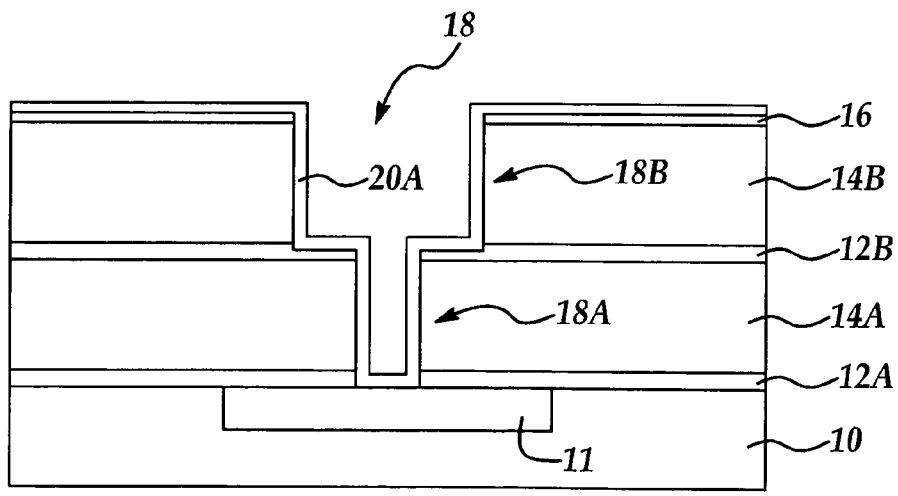

Referring to FIG. 1C, according to an aspect of the invention, a PVD method is then carried out to blanket deposit a barrier layer 20A, preferably including one of a refractory metal, refractory metal nitride, and silicided refractory metal nitride layer, for example Ta, Ti, W, TaN, TiN, WN, TaSiN, TiSiN, and WSiN. In a preferred embodiment, the barrier layer 20A is formed of Ta/TaN, TaN, or TaSiN, most preferably, a Ta/TaN composite layer. Preferably, the Ta/TaN layer is deposited by an ion metal plasma (IMP) process with the barrier layer 20A preferably deposited to a thickness of between about 100 Angstroms and about 350 Angstroms.

Figure 1D:
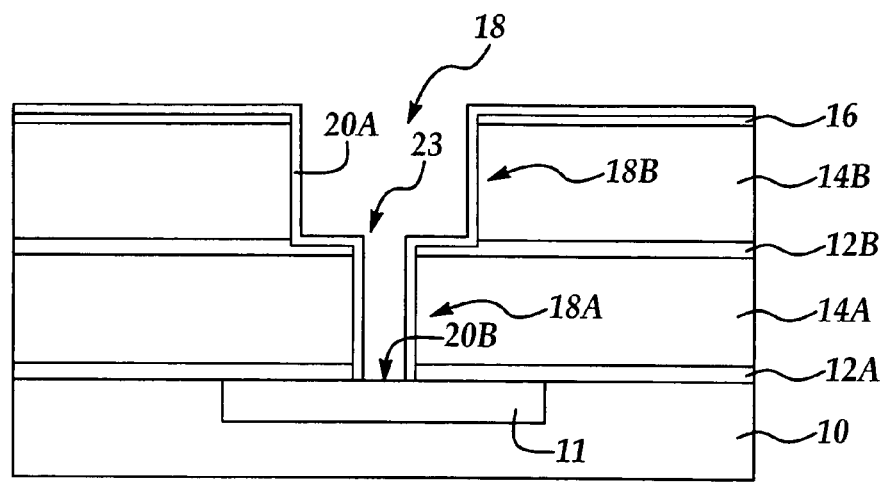
Figure 1E:
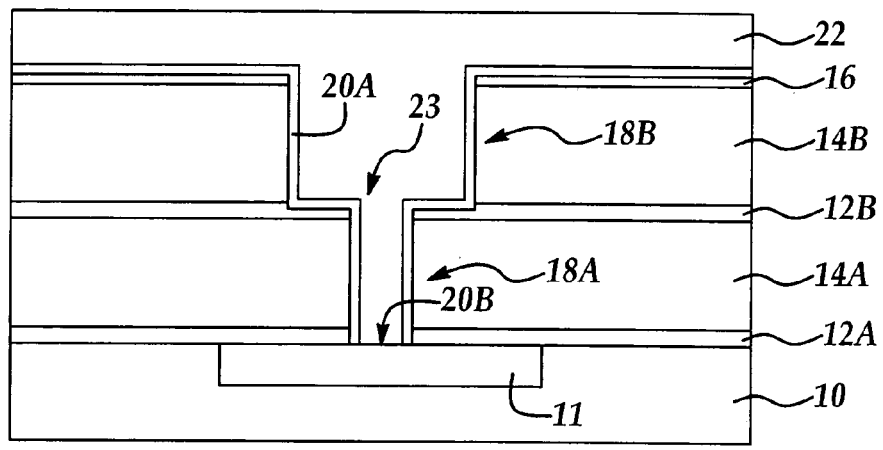

Referring to FIG. 1D, In an important aspect of the invention, a remote plasma etch treatment including one or more inert plasma source gases such as nitrogen, helium, and argon is carried out to etch a portion of the barrier layer 20A. Preferably the remote plasma etch treatment is carried out to remove the barrier layer 20A covering the bottom portion 20B of via portion 18A of the dual damascene opening to reveal the underlying conductive portion 11, for example a copper interconnect. It has been found that the remote plasma etch treatment carried out according to preferred embodiments, serves to make the barrier layer 20A more uniform in thickness at the sidewalls of the trench portion 18B and the via portion 18A of the dual damascene opening while removing the bottom portion of via portion 18A. Preferably, the barrier layer 20A following the remote plasma treatment is formed having a thickness between about 50 Angstroms and about 250 Angstroms.

Advantageously, according to the present invention, the barrier layer 20A is made more uniform in thickness following the remote plasma etch process along the sidewalls and corner portions, e.g., at the trench/via transition portion e.g., 23 extending through a thickness portion of the SiON/SiC composite etch stop layer 12B. Advantageously, the barrier layer 20A may be made thinner with increased thickness uniformity along the sidewalls including corner portions to reduce an electrical resistivity contribution of the barrier layer 20A while assuring sufficient coverage to avoid copper diffusion and migration into the IMD layers.

Figure 2:
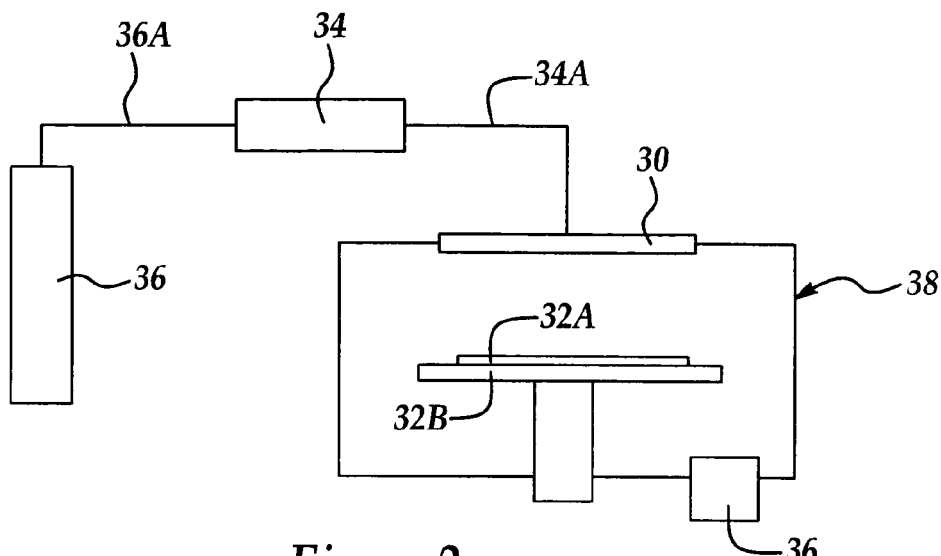
FIG. 2 is a schematic diagram of an exemplary remote plasma etch system for carrying out embodiments of the method of the present invention.

Referring to FIG. 2 is shown a conventional remote plasma etcher configuration suitable for use with the method of the present invention. Remote plasma source 34 generally comprises a chamber coupled to one or more plasma gas sources e.g., 36 via gas lines e.g., 36A. Remote plasma source 34 is positioned upstream of process chamber e.g., 38 and fluidly coupled by a conduit e.g., 34A to process chamber 38 through a gas diffusion (distribution) manifold 30. The plasma generated by the remote plasma source 34 enters the process chamber 38 through the gas diffusion manifold 30 and is directed downward to impact process wafer 32A supported on wafer pedestal 32B. The wafer pedestal 32B may be connected to a DC or an RF bias source (not shown). A gas pumping port, e.g., 36 maintains a desired operating pressure in the process chamber, for example between about 1 mTorr and about 100 mTorr. The remote plasma source 34 may include an RF generator and electrodes (not shown) and may include deflectors (not shown) to direct the flow of gas in a spiral flow pattern. The remote plasma source 34, for example, may operate at between about 1000 and about 5000 Watts of RF power, at a frequency between about 1 MHz and about 100 MHz. The remote plasma source 34 may alternately include a remote microwave plasma source including a microwave cavity coupled to a microwave generator operating between about 1500 and 2500 watts, at a frequency of between about 1 and 5 GHz.

Referring back to FIG. 1E, conventional copper deposition processes, preferably electrochemical deposition (ECD) of copper preceded by deposition of a copper seed layer (not shown) is then carried out to fill the dual damascene opening with copper layer 22. Advantageously, the copper seed layer is advantageously able to be formed more reliably over the more uniform step coverage of remote plasma etched barrier layer 20A. For example, the copper seed layer is preferably deposited to a thickness of between about 50 Angstroms and about 150 Angstroms.

Figure 1F:
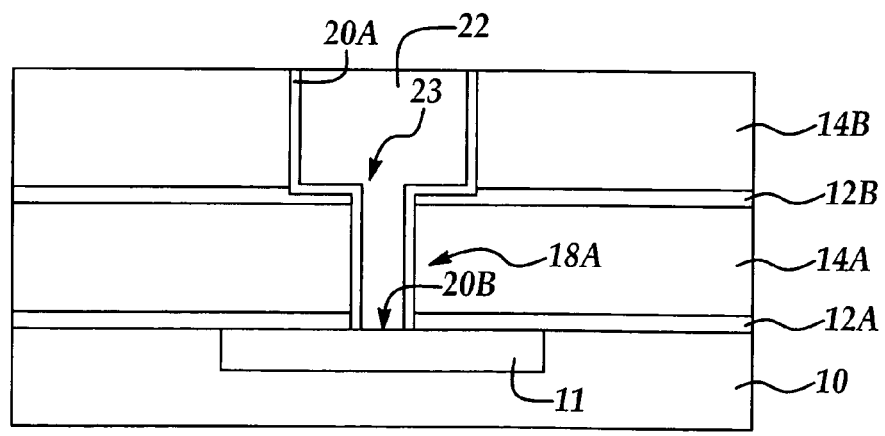

Referring to FIG. 1F, a conventional planarization process, for example a chemical mechanical polish (CMP) process is then carried out to remove the excess portion of copper layer 22 above the damascene opening level, preferably including barrier layer 20A, and the ARC layer 16 to complete the formation of the copper dual damascene.

Figure 3:
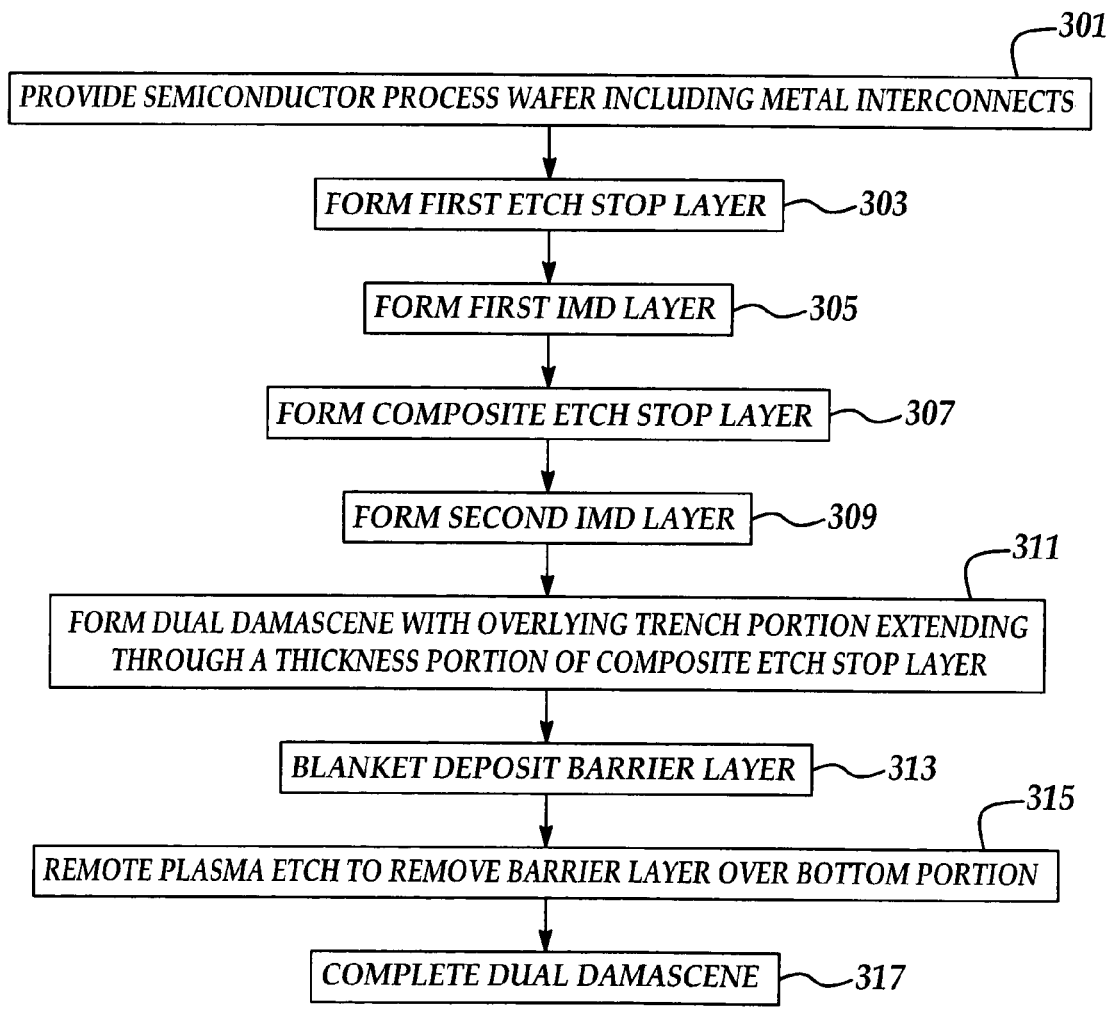
FIG. 3 is a process flow diagram including several embodiments of the present invention.

Referring to FIG. 3 is shown a process flow diagram including several embodiments of the present invention. In process 301, a semiconductor wafer process surface is provided including metal interconnects formed in a dielectric insulating layer. In process 303, a first etch stop layer is formed over the process surface according to preferred embodiments. In process 305 a first IMD layer is formed over the first etch stop layer according to preferred embodiments. In process 307, a composite etch stop layer is formed over the first IMD layer according to preferred embodiments. In process 309, a second IMD layer is formed over the composite etch stop layer. In process 311, a via opening followed by formation of an overlying trench opening is formed stopping on the composite etch stop layer, e.g., extending through a thickness portion of the composite etch stop layer to form a dual damascene opening. In process 313, a barrier layer is blanket deposited to line the dual damascene opening according to a PVD process. In process 315, a remote plasma etch treatment is carried out to remove a portion of the barrier layer including the bottom portion of the via portion to reveal an underlying metal interconnect portion. In process 317, the dual damascene is completed by conventional processes including filling with copper and planarization.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a copper dual damascene with improved barrier layer thickness uniformity and improved electrical resistivity comprising the steps of:
    providing a substrate comprising upper and lower dielectric insulating layers separated by a middle etch stop layer comprising multiple layers;
    forming a dual damascene opening by first forming a via extending through a thickness of the upper and lower dielectric insulating layers;
    then forming an upper trench line portion extending through the upper dielectric insulating layer thickness and partially through the middle etch stop layer thickness including an uppermost layer comprising the middle etch stop layer;
    then blanket depositing a barrier layer comprising at least one of a refractory metal and refractory metal nitride to line the dual damascene opening;
    then removing a bottom portion of the barrier layer to reveal an underlying conductive area according to a plasma etching process, said plasma etching process further improving said barrier layer thickness uniformity along trench and via sidewalls; and,
    then filling the dual damascene opening with copper to provide a substantially planar surface.

2. The method of claim 1, wherein the middle etch stop layer comprises at least two different material layers including a lowermost layer and an uppermost layer.

3. The method of claim 1, wherein the middle etch stop layer comprises at least two different material layers selected from the group consisting of silicon nitride, silicon oxynitride, silicon carbide, and silicon oxycarbide.

4. The method of claim 1, wherein the middle etch stop layer comprises a lowermost layer selected from the group consisting of silicon nitride and silicon oxynitride and an uppermost layer selected from the group consisting of silicon carbide, and silicon oxycarbide.

5. The method of claim 1, wherein the middle etch stop layer comprises a silicon oxynitride lowermost layer and a silicon carbide uppermost layer.

6. The method of claim 1, wherein the barrier layer is selected from the group consisting of Ta, Ti, W, TaN, TiN, WN, and TaSiN.

7. The method of claim 1, wherein the barrier layer consists essentially of a Ta/TaN composite layer.

8. The method of claim 1, wherein the step of blanket depositing is selected from the group consisting of a PVD process and an ion metal plasma (IMP) process.

9. The method of claim 1, wherein the step of removing a bottom portion comprises a remote plasma etch treatment.

10. The method of claim 9, wherein the remote plasma etch treatment comprises one of an RF and microwave power source.

11. The method of claim 1, wherein the underling conductive area comprises copper.

12. The method of claim 1, wherein the step of filling the dual damascene opening with copper comprises the steps of:
    depositing a copper seed layer;
    carrying out an electro-chemical deposition process to fill the dual damascene opening with a copper filling; and, carrying out a CMP process to remove at least the copper filling portion overlying the dual damascene opening level.

13. A method for forming a copper dual damascene with improved improved electrical resistivity and barrier layer thickness uniformity comprising the steps of:

providing a substrate comprising upper and lower dielectric insulating layers separated by a composite middle etch stop layer;

forming a dual damascene opening by first forming a via extending through a thickness of the upper and lower dielectric insulating layers;

then forming an upper trench line portion extending through the upper dielectric insulating layer thickness and partially through a thickness of the middle etch stop layer;

then blanket depositing a barrier layer comprising at least one of a refractory metal and refractory metal nitride to line the dual damascene opening;

then carrying out a remote plasma etch treatment of the dual damascene opening to remove a bottom portion of the barrier layer to reveal an underlying conductive portion, said remote plasma etch further improving said barrier layer thickness uniformity along trench and via sidewalls; and, then filling the dual damascene opening with copper to provide a substantially planar surface.

14. The method of claim 13, wherein the composite etch stop layer comprises a lowermost layer selected from the group consisting of silicon nitride and silicon oxynitride and an uppermost layer selected from the group consisting of silicon carbide, and silicon oxycarbide.

15. The method of claim 13, wherein the composite etch stop layer comprises a silicon oxynitride lowermost layer and a silicon carbide uppermost layer.

16. The method of claim 13, wherein the barrier layer is selected from the group consisting of Ta, TI, W, TaN, TiN, WN, and TaSiN.

17. The method of claim 13, wherein the barrier layer consists essentially of a Ta/TaN composite layer.

18. The method of claim 13, wherein the step of blanket depositing is selected from the group consisting of a PVD process and an ion metal plasma (IMP) process.

19. The method of claim 13, wherein the remote plasma etch treatment comprises a remote plasma generator disposed upstream of an etch process chamber.

20. The method of claim 13, wherein the remote plasma etch treatment comprises one of an RF and microwave power source.

21. The method of claim 13, wherein the underling conductive area comprises copper.

22. The method of claim 13, wherein the step of filling the dual damascene opening with copper comprises the steps of:

depositing a copper seed layer;

carrying out an electro-chemical deposition process to fill tho dual damascene opening with a copper filling; and, carrying out a CMP process to remove at least the copper filling portion overlying the dual damascene opening level.

* * * * *